May 26, 1964 J. J. TIEMANN 3,134,949

NEGATIVE RESISTANCE FREQUENCY MODULATED OSCILLATOR

Filed Jan. 8, 1960 2 Sheets-Sheet 1

Inventor:
Jerome J. Tiemann,
by John F. Ahern
His Attorney.

May 26, 1964 J. J. TIEMANN 3,134,949

NEGATIVE RESISTANCE FREQUENCY MODULATED OSCILLATOR

Filed Jan. 8, 1960 2 Sheets-Sheet 2

Inventor:
Jerome J. Tiemann,
by John F. Ahern
His Attorney.

United States Patent Office 3,134,949
Patented May 26, 1964

3,134,949
NEGATIVE RESISTANCE FREQUENCY MODULATED OSCILLATOR

Jerome J. Tiemann, Burnt Hills, N.Y., assignor to General Electric Company, a corporation of New York Filed Jan. 8, 1960, Ser. No. 1,215
7 Claims. (Cl. 332—30)

This invention relates in general to oscillator circuits and in particular to a frequency modulated oscillator utilizing a single semiconductor device as the active element thereof.

The semiconductor device used in the practice of this invention is a narrow junction degenerate semiconductor diode. By a "degenerate semiconductor" is meant a body of N-type semiconductor to which has been added a sufficient concentration of excess donor impurity to raise the Fermi-level to a higher energy than the conduction band edge; or to a P-type body to which has been added a sufficient concentration of excess acceptor impurity to depress the Fermi-level to a lower energy than the valence band edge.

When a device is formed having such degenerate semiconductor on both sides of a P-N junction, respectively, the device exhibits a region of strong negative resistance at the low forward voltage range of its current-voltage characteristic. While the range of the negative resistance region of such a device varies depending upon the semiconductor material used, it is usually in the forward voltage range of less than one volt. For example, for germanium the range is from about 0.04 to 0.3 volt, for silicon about 0.08 to 0.4 volt and for gallium antimonide about 0.03 to 0.3 volt. Such a device is referred to herein as a narrow junction semiconductor device.

For further details concerning the semiconductor devices used in the practice of this invention, reference may be had to my copending application, Serial No. 859,995, filed December 11, 1959, incorporated herein by reference and assigned to the assignee of the present application. The aforementioned application has been abandoned in favor of a continuation-in-part application, Serial No. 74,815, filed September 9, 1960, which discloses and claims the subject matter of the parent application.

Many frequency modulated oscillator circuits, using vacuum tubes and transistor, are known. These devices are phase inverting and, therefore, an additional feedback network is required to re-invert the phase. Further, such devices require a bias voltage on the control element in addition to the power supply for the output element voltage. This requires additional circuit components and contributes to the cost and complexity of such circuits.

It is an object of this invention, therefore, to provide an improved frequency modulated oscillator circuit which overcomes one or more of the disadvantages of the prior art arrangements and which has an improved sensitivity.

It is another object of this invention to provide a new and improved frequency modulated oscillator using a single narrow junction degenerate semiconductor diode as the active element thereof.

It is another object of this invention to provide a frequency modulated oscillator which is simpler and operates on lower voltages and lower power than prior arrangements.

It is still another object of this invention to provide a sensitive frequency modulated oscillator circuit capable of operation over an extremely wide frequency range.

Briefly stated, in accord with one aspect of this invention, a frequency modulated oscillator circuit comprises a narrow junction degenerate semiconductor diode which exhibits a negative resistance characteristic at low forward voltages. Bias means in circuit with the diode provides an average operating point for the diode in the region of negative resistance. A resonant circuit provides a high impedance at its resonant frequency to cause the diode to produce oscillations. Modulation means in parallel with the diode vary the bias to change the capacity of the diode and produce a change in the frequency of oscillations in accordance with this variation. The modulation means, for example, may be any current or voltage signal source whose value is desired to control the frequency of the oscillations. This may be a continuously varying signal source such as an audio frequency source, for example, or the output of a device, where the current or voltage may not be varying but may have a value other than zero.

My invention will be better understood from the following description taken in connection with the accompanying drawings and its scope will be pointed out in the appended claims.

Figure 1:
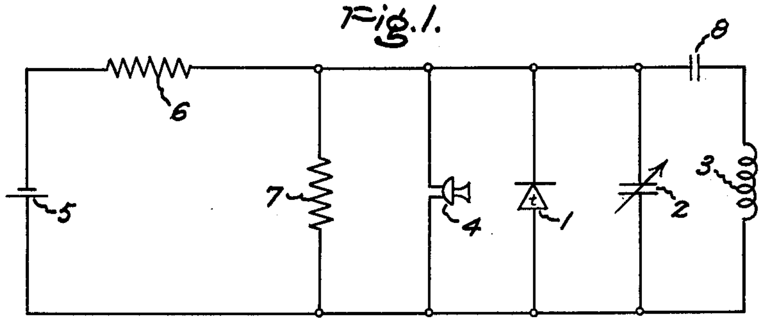
FIG. 1 is a schematic circuit diagram illustrating one embodiment of this invention.

Referring now to FIG. 1, there is shown therein a narrow junction degenerate semiconductor diode 1, a resonant circuit, such as for example the parallel tuned circuit, including capacitor 2 and inductance 3 and a microphone 4 all connected in parallel with a bias means which includes voltage source 5 and series-parallel resistances 6 and 7. Capacitor 8 serves to block direct current flow in inductance 3 and as a by-pass for the alternating current produced by the oscillator.

In operation, diode 1 is provided with a low forward direct current voltage such that a direct current load-line is established which intersects the current-voltage characteristic of diode 1 only in the negative resistance region. This forward voltage may be supplied, for example, by voltage source 5 and series-parallel resistances 6 and 7.

Figures 2, 3:
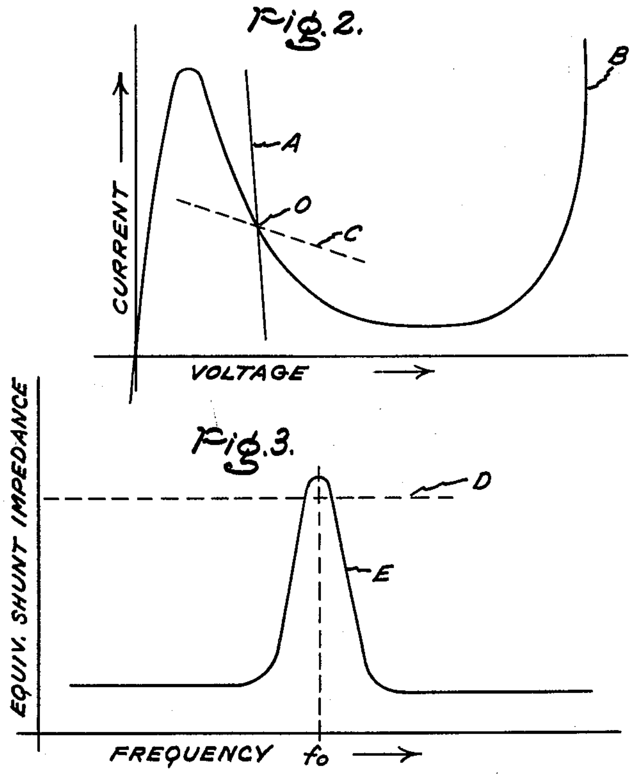
FIG. 2 is a typical current-voltage characteristic of a semiconductor device suitable for use in the practice of this invention and illustrates the relation of the current-voltage characteristic with the direct current load line and the equivalent shunt impedance of the circuit at the operating frequency.
FIG. 3 is a curve illustrating the equivalent shunt impedance of the circuit of FIG. 2 with respect to frequency.

For stability at an operating point in the negative resistance region of the diode characteristic, the equivalent shunt resistance of the circuit must be less than the absolute value of the negative resistance of the diode at the point of operation. The absolute value of the negative resistance at the operating point is determined by the slope of the current-voltage characteristic at that point. Shunt resistance 7, therefore, is selected to have a value less than this negative resistance to assure the desired stability. A stable point O and the direct current load line A, in relation to the current-voltage characteristic B, of diode 1 is shown in FIG. 2. When the equivalent shunt impedance of the circuit exceeds the absolute value of the negative resistance of diode 1, stability is lost and oscillation results.

The frequency of oscillation is determined by the frequency at which the equivalent shunt impedance has its highest value. Reference to FIG. 3, which shows the equivalent shunt impedance as a function of frequency, illustrates that the highest value thereof is at the resonant frequency of the resonant circuit of capacitance 2 and inductance 3 in FIG. 1. The load line, representing this impedance at the operating frequency, is shown at C of FIG. 2. FIG. 3 also shows, at D, the value of the negative resistance of diode 1 and its relation to the equivalent shunt impedance at the resonant frequency, $f_0$. The diode, therefore, produces oscillations at a frequency corresponding to the resonant frequency $f_0$ of the resonant circuit. A "resonant circuit" as used herein is intended to inculde lumped parameter tuned circuits, strip lines, cavities and others capable of exhibiting a parallel resonance characteristic, such as might be shown generally by the curve E of FIG. 3.

When this resonant frequency is varied, such as for example, at an audio frequency rate, a frequency modulated oscillator results. This is accomplished in the circuit of FIG. 1 by varying the bias on diode 1, such as by means of microphone 4. This variation of bias causes a change in the junction capacity of diode 1. Since the junction capacity of the diode enters into the resonant frequency of the resonant circuit, a change in the value of this capacity changes the resonant frequency and thus the frequency of oscillation. In addition, because the negative resistance characteristic of diode 1 applies to all frequencies, the modulation signal is amplified making the frequency modulated oscillator extremely sensitive. This is distinct from the case where positive feed-back is obtained by means of a phase shift circuit. For such a case the positive feedback appears only at the resonant frequency.

Figure 4:
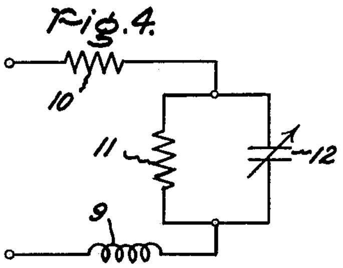
FIG. 4 is an equivalent circuit of a narrow junction degenerate semiconductor diode device suitable for use in the practice of this invention.

The change in junction capacity with change in bias can best be illustrated by reference to the equivalent circuit of a narrow junction degenerate semiconductor diode, such as may be used in the practice of this invention. Such an equivalent circuit is shown in FIG. 4, wherein inductance 9 and resistance 10, represent the lead inductance and the series resistance respectively. The series resistance 10 results from the ohmic losses in the leads and the semiconductor material itself. Resistance 11 represents the negative resistance and capacitance 12 the junction capacity, which is shunted thereacross.

It has been determined that the junction capacity 12 varies with the voltage across the diode according to the following relation:

$$C_i=\sqrt{\frac{K}{V_0-V}}$$

where $C_j$=junction capacitance having units of farads $V_0$=the "built-in" voltage of the junction. For example, in a germanium device this is +0.8 volt $V$=the applied bias having units of volts and K represents a constant which depends upon the area of the junction, semiconductor material and details of fabrication of the narrow junction semiconductor diode. The "built-in" voltage, $V_0$, referred to above is substantially equal to the band gap plus the sum of the depths the two Fermi-levels have penetrated the conduction and valence bands. For example, the band gap for germanium is approximately 0.7 volt hence for the device referred to above the sum of the Fermi-level penetration into the band was approximately 0.1 volt. This value depends on the amount of excess donor and acceptor impurity impregnated into the semiconductor.

As the voltage across the diode is changed and moved through the range corresponding to the negative resistance region, there has been found to be approximately a 20 percent change in the junction capacity. It is this variation in capacitance of diode 1 with variation in its bias voltage which causes the output frequency of the oscillator circuit to change in accord with the modulation signal.

In the circuit of FIG. 1 the bias on diode 1 is varied at a predetermined rate, such as by means of an audio frequency signal through microphone 4 for example. This variation in bias causes a change in the junction capacity of diode 1 and a change in the resonant frequency of the tuned circuit which consequently causes the frequency of the output to change in accord with this variation. Alternatively, the oscillator may be modulated by means of a signal impressed on the circuit through a transformer or any other coupling means if desired. In addition, any desired current or voltage source may be utilized to vary the bias on diode 1 to control the output frequency in accordance with the value of this source.

Figure 5:
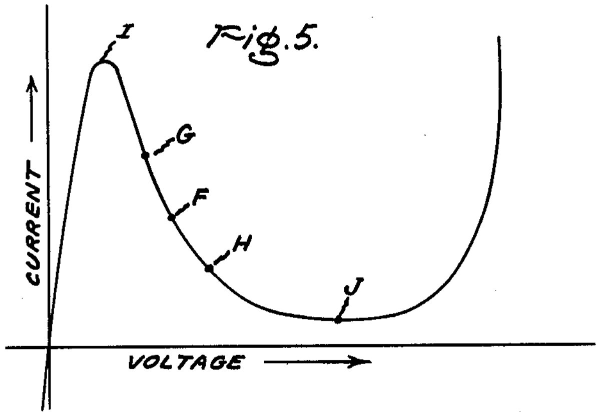
FIG. 5 is a typical current-voltage characteristic of a narrow junction degenerate semiconductor device, such as may be used in the practice of this invention, showing operating points corresponding to different bias conditions of the diode.

A further embodiment of the present invention may be described with reference to FIG. 5, wherein the current-voltage characteristic of a narrow junction semiconductor diode is shown with operating points shown at F, G and H.

When the ratio of inductance to capacitance in the resonant circuit is very large compared to the square of the magnitude of the negative resistance, a much greater frequency modulation may be obtained than is produced by the capacity variation of diode 1. For a 100 ohm negative resistance diode, for example, this ratio must be much larger than $10^4$. Assume initially that diode 1 is biased for operation in the negative resistance region such as shown at F of FIG. 5 as described hereinbefore and that the ratio of inductance to capacitance of the resonant circuit is very large compared to the square of the magnitude of the negative resistance. As the bias on the diode is changed in accordance with the modulation signal the operating point is changed to a different position in the negative resistance region. At a particular change in the bias the operating point may be such as shown at G of FIG. 5. This change in the operating point results in a change in the output wave form and the total period of the oscillator changes.

The total period of oscillation is divided into two portions of time. One portion occurs when diode 1 is in the positive conductance state shown by the region between the origin and the point of maximum peak current in the current-voltage characteristic of FIG. 5. The other portion occurs when the diode is in the positive conductance state beyond the negative resistance region of the current-voltage characteristic of FIG. 5.

Since the time spent in switching across the negative resistance region is small compared to the time spent in the other two states, the total period equals the sum of these times spent in the two states. The value of these times is due to the circuit relaxing back to the direct current operating point. Therefore, these times and hence the period depends upon the position of the direct current operating point. Since the operating point is determined by the intersection of the direct current load line with the current-voltage characteristic, its position in the negative resistance region is related to the bias on diode 1.

Figure 6:
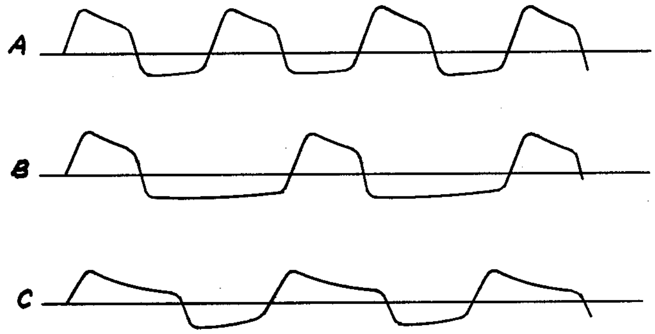
FIG. 6 shows the output waveforms for the different bias conditions shown in FIG. 5.

The variation in the output waveform, as the bias point is moved across the negative resistance region, will be from positive going spikes, through a "square wave" to negative going spikes. There is a great variation, therefore, in the output frequency of the oscillator as the bias is varied across the negative resistance region. This change in the period of oscillation may be shown by reference to the output waveforms for the different bias conditions of diode 1 represented by the operating points F, G and H and shown by FIGS. 6*a*, 6*b* and 6*c* respectively.

Figure 7:
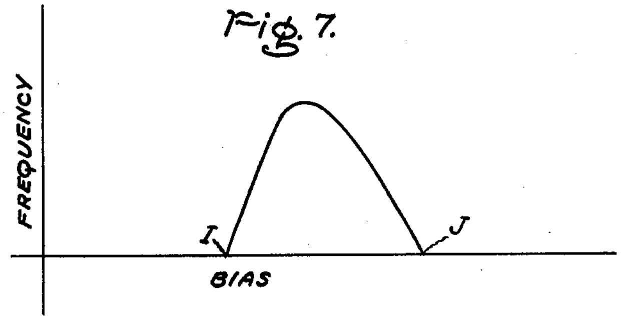
FIG. 7 is a curve illustrating the relationship between frequency and diode bias.

This relationship between the output frequency and the bias condition of diode 1, when the ratio of inductance to capacitance is very large compared to the square of the magnitude of the negative resistance, is shown by the curve of FIG. 7. The frequency reaches a maximum at a bias which establishes a direct current load line substantially in the center of the negative resistance region of the current-voltage characteristic and zero at I and J.

One circuit constructed in accord with the present invention for providing frequency modulation at an audio rate, utilized the following circuit paramaters, which are given by way of example only:

Diode 1=narrow junction degenerate semiconductor having a peak current of 0.6 ma.
Capacitor 2=3–12 micromicrofarads
Inductance 3=0.25 microhenries
Voltage sources=1.38 volt mercury cell
Resistance 6=1000 ohms
Resistance 7=180 ohms
Microphone 4=1000 ohm direct current resistance dynamic earphone The effect of the earphone was to produce a variation in the bias on the diode at an audio rate to modulate its capacity and change the output frequency of the oscillator in accordance with this change. With a dipole antenna the above circuit produces sufficient radio-frequency output to radiate approximately one half mile.

While only certain preferred embodiments of the present invention have been shown by way of illustration, many modifications and changes will occur to those skilled in the art and it is, therefore, to be understod that the appended claims are intended to cover all such modifications and changes as fall within the true spirit and scope of the invention.

What I claim as new and desire to secure by Letters Patent of the United States is:

1. A frequency modulated oscillator circuit comprising: a narrow junction degenerate semiconductor diode exhibiting a region of negative resistance at the low forward voltage range of its current-voltage characteristic; bias means establishing a direct current load line which intersects said current-voltage characteristic only in the region of negative resistance; a parallel resonant circuit connected in parallel circuit relation with said diode; and modulation means for varying the bias on said diode to change the output frequency of said oscillator circuit in accordance with the variation of said bias.

2. A frequency modulated oscillator circuit comprising: a narrow junction degenerate semiconductor diode exhibiting a region of negative resistance at the low forward voltage range of its current-voltage characteristic; a parallel resonant circuit connected in parallel circuit relation with said diode; bias means in circuit with said diode and said resonant circuit establishing a direct current load line which intersects said current-voltage characteristic only in the region of negative resistance; and modulation means for varying the bias on said diode and its junction capacitance to cause a change in the resonant frequency of said resonant circuit and the output frequency of said oscillator circuit in accordance with said varying bias.

3. A frequency modulated oscillator circuit comprising: a narrow junction degenerate semiconductor diode exhibiting a negative resistance region in the low forward voltage range of its current-voltage characteristic; a parallel resonant circuit connected in parallel circuit relation with said diode, said circuit having an impedance at its parallel resonant frequency which is greater than the absolute value of the negative resistance of said diode; bias means in circuit with said diode and said resonant circuit establishing a direct current load line which intersects said current-voltage characteristic only in the negative resistance region; and modulation means varying the bias on said diode and the position of its operating point in the negative resistance region to cause a change in the output waveform and the frequency of the oscillations.

4. A frequency modulated oscillator circuit, comprising: a narrow junction degenerate semiconductor diode exhibiting a region of negative resistance at the low forward voltage range of its current-voltage characteristic; bias means in circuit with said diode establishing a direct current load line which intersects said current-voltage characteristic only in the negative resistance region; a parallel resonant circuit connected in parallel with said diode and having its highest impedance at its parallel resonant frequency to cause said diode to produce oscillations at a frequency corresponding thereto; and modulation means varying the bias voltage on said diode to cause a change in the junction capacitance thereof and a change in the reseonant frequency of said resonant circuit resulting in a variation in the output frequency in accord with the variation in said bias caused by said modulation means.

5. A frequency modulated oscillator circuit comprising: a narrow junction degenerate semiconductor diode exhibiting a negative resistance region in the low forward voltage range of its current-voltage characteristic; a parallel resonant circuit including inductance and capacitance connected in parallel circuit relation with said diode, the ratio of inductance to capacitance of said resonant circuit being large compared to the square of the magnitude of the negative resistance of said diode; bias means in circuit with said diode and said resonant circuit establishing a direct current load line which intersects said current-voltage characteristic only in the negative resistance region; and means for varying the bias on said diode to change the frequency of the output of said oscillator.

6. The frequency modulated oscillator circuit of claim 1 wherein the modulation means is a microphone connected in parallel with said diode.

7. A frequency modulated oscillator circuit comprising: a narrow junction degenerate semiconductor diode exhibiting a negative resistance region in the low forward voltage range of its current-voltatge characteristic; a parallel resonant circuit, including a parallel capacitance and inductance combination, connected in parallel circuit relationship with said diode; bias means including a voltage source and first and second resistance in series parallel combination therewith to establish a direct current load line which intersects said current-voltage characteristic only in the negative resistance region; and modulation means varying the bias on said diode to change the output frequency of said oscillator circuit in accordance with the variation of said bias.

References Cited in the file of this patent

UNITED STATES PATENTS

| | | |
|---|---|---|
| 2,469,569 | Ohl | May 10, 1949 |
| 2,708,739 | Bucher | May 17, 1955 |
| 2,906,962 | Roth et al. | Sept. 29, 1959 |
| 2,975,377 | Price et al. | Mar. 14, 1961 |
| 2,986,724 | Jaeger | May 30, 1961 |
| 2,997,604 | Shockley | Aug. 22, 1961 |

FOREIGN PATENTS

| | | |
|---|---|---|
| 158,879 | Australia | Sept. 16, 1954 |

OTHER REFERENCES

Sommers: Proceedings of IRE; July 1959, pages 1201–1206.